United States Patent
Hedler et al.

(10) Patent No.: US 7,365,438 B2
(45) Date of Patent: Apr. 29, 2008

(54) SEMICONDUCTOR DEVICE WITH SEMICONDUCTOR COMPONENTS CONNECTED TO ONE ANOTHER

(75) Inventors: Harry Hedler, Germering (DE); Simon Muff, Mering (DE)

(73) Assignee: Infineon Technologies AG, Munich (DE)

( * ) Notice: Subject to any disclaimer, the term of this patent is extended or adjusted under 35 U.S.C. 154(b) by 19 days.

(21) Appl. No.: 11/172,083

(22) Filed: Jun. 30, 2005

(65) Prior Publication Data

US 2006/0027935 A1   Feb. 9, 2006

(30) Foreign Application Priority Data

Aug. 4, 2004   (DE) ............... 10 2004 037 826

(51) Int. Cl.
*H01L 23/48* (2006.01)
*H01L 23/52* (2006.01)
*H01L 29/40* (2006.01)

(52) U.S. Cl. ............... 257/778; 257/784; 257/E21.503

(58) Field of Classification Search ............... 257/778, 257/783, 784, E21.503; 438/108
See application file for complete search history.

(56) References Cited

U.S. PATENT DOCUMENTS

| | | | | |
|---|---|---|---|---|
| 3,736,475 A | * | 5/1973 | Berner | 257/666 |
| 6,097,097 A | * | 8/2000 | Hirose | 257/778 |
| 6,133,637 A | * | 10/2000 | Hikita et al. | 257/777 |
| 6,350,954 B1 | * | 2/2002 | Specks et al. | 174/551 |
| 6,420,787 B1 | * | 7/2002 | Kobayashi et al. | 257/777 |
| 6,433,422 B1 | | 8/2002 | Yamasaki | |
| 6,465,892 B1 | * | 10/2002 | Suga | 257/777 |
| 6,680,218 B2 | * | 1/2004 | Chung et al. | 438/108 |
| 7,030,486 B1 | * | 4/2006 | Marshall | 257/712 |
| 2004/0238942 A1 | * | 12/2004 | Chakravorty et al. | 257/700 |
| 2005/0067714 A1 | * | 3/2005 | Rumer et al. | 257/778 |

* cited by examiner

*Primary Examiner*—Michelle Estrada
(74) *Attorney, Agent, or Firm*—Jenkins, Wilson, Taylor & Hunt, P.A.

(57) ABSTRACT

The present invention relates to a semiconductor device which provides a shortest possible connection between two semiconductor components 10a and 10b arranged in a manner lying opposite on a substrate 2. The two semiconductor components 10a and 10b are in each case arranged with their chip contact-connection regions 11a and 11b facing the substrate 2. A vertical through-plating device 20 connects the two chip contact-connection regions 11a and 11b.

10 Claims, 5 Drawing Sheets

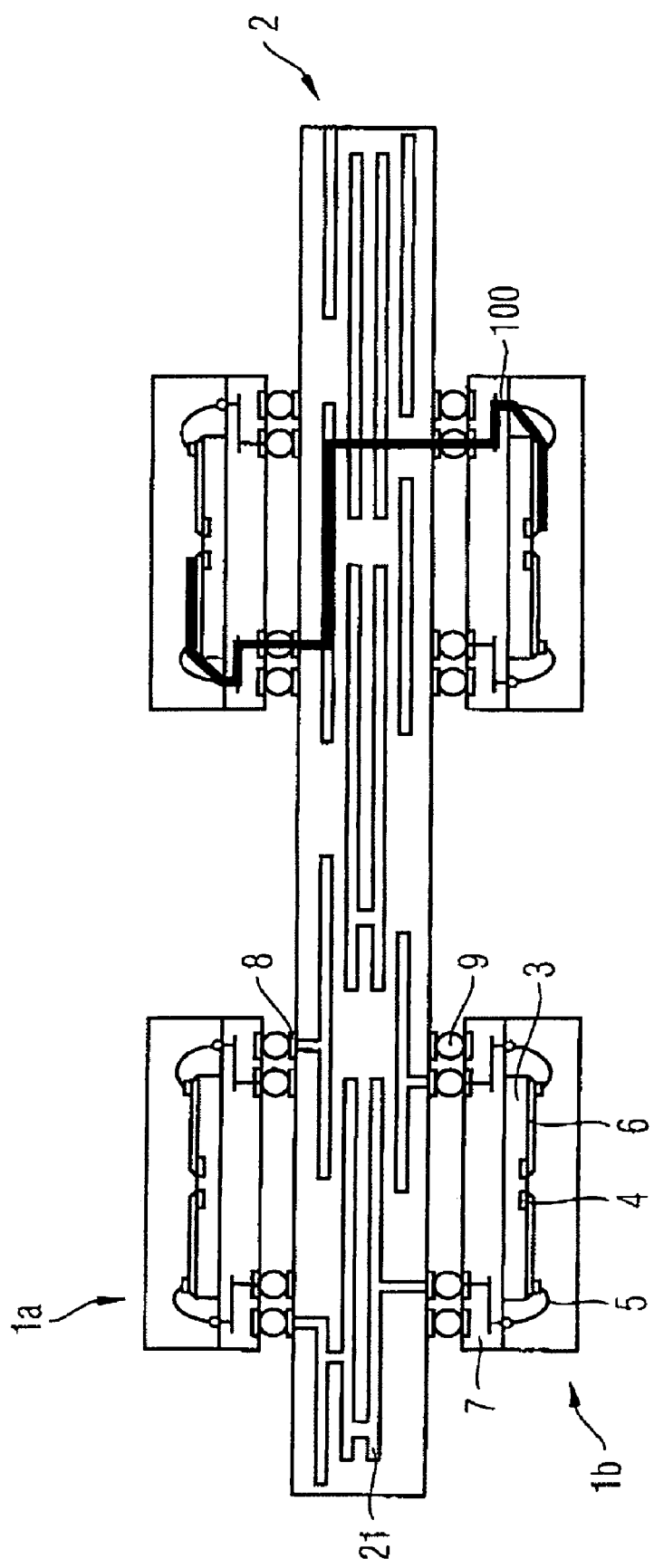

ically in FIG. 7. Memory components 1a and 1b are# SEMICONDUCTOR DEVICE WITH SEMICONDUCTOR COMPONENTS CONNECTED TO ONE ANOTHER

DESCRIPTION

1. Technical Field

The present invention relates to a semiconductor device with semiconductor components connected to one another.

2. Background Art

Although the present invention is described below with regard to modules comprising semiconductor memory components on a multilayer printed circuit board, the invention is not restricted thereto.

Memory components are expediently combined to form larger modules by a plurality of memory components being mounted on a multilayer printed circuit board. A larger storage capacity of a module is achieved in this way. A typical arrangement of such a module is shown by way of example in FIG. 7. Memory components 1a and 1b are mounted on both sides on a multilayer printed circuit board 2. The memory components typically have a housing and external contact-connections 9. Within the housing, the memory components 1a and 1b are connected by their chip contact-connection regions 4 to the external contact-connections 9 via a rewiring device 6, bonding wiring devices 5 and wirings in an interposer substrate 7. The external contact-connections 9 are connected to conductor tracks 21 of the printed circuit board 2 via contact areas 8 of the printed circuit board 2. This disadvantageously gives rise to a multiplicity of intermediate contact-connections with parasitic capacitances.

Arranging identical memory components 1a and 1b on both sides on the multilayer printed circuit board 2 additionally has the effect that the line routing between the symmetrically arranged chips 1a and 1b is extremely long. Functionally identical chip contact-connection regions 4 of the chips which have to be connected to one another in an expedient manner are situated in a manner arranged crosswise as a result of the mounting on both sides. The wiring 100 therefore runs firstly from a central region with the chip contact-connection regions 4 of the first semiconductor component 1a to an outer region with the external contact-connection 9, then laterally within the printed circuit board 2 onto the opposite side to the identical external contact-connection of the second semiconductor component 1b, to end within the semiconductor component 1b at the centrally arranged chip contact-connection region 4. This results in connecting lengths in the range of many millimeters, with the disadvantageous properties of a high capacitance and a high inductance.

The contact-connections of the external contacts 9 of the housing on the printed circuit board 2 and the bonding wires 5 with the associated contact regions represent parasitic capacitances. The large number of contact-connection transitions adversely influences the signal transmission; in particular, it limits the transmission speed.

A further substantial limitation results from a mismatch of the impedance. The length of a wiring path is to be related to the wavelength of an electric field with a typical frequency of a signal. In this case, for connecting paths that are longer than a tenth of the wavelength, a good impedance matching is indispensable in order to be able to communicate a signal with sufficient strength. However, a simple impedance matching is not possible for wirings if said wiring has branchings of the signal lines to different memory components. This gives rise to the problem that, as the frequency increases and the wavelength of the signals thus becomes shorter, the wiring of current memory modules is too long to enable a sufficient transmission quality.

SUMMARY OF THE INVENTION

It is an object of the present invention to provide a semiconductor device which enables a signal transmission between semiconductor components even at high frequencies.

The invention achieves the object by means of the semiconductor device described in claim 1.

The semiconductor device according to the invention makes it possible to provide memory modules according to the DDRIII standard and memory modules with even higher transmission frequencies.

The semiconductor device according to the invention has a substrate with a vertical through-plating device, which connects a first contact area on a first contact-connection side of the substrate to a second contact area on a second contact-connection side of the substrate, the second contact-connection side being opposite to the first contact-connection side. A first semiconductor component is arranged on the first contact-connection side, its first chip contact-connection region being oriented in a manner facing the substrate. Correspondingly, the second semiconductor component is arranged with its second chip contact-connection region facing the substrate on the second contact-connection side. A first and a second contact-connection device connect the first and respectively the second chip contact-connection region to the first and respectively second contact area. The advantage of this arrangement consists in the fact that there is no need for any lateral rewiring on the semiconductor components and there is no need for any lateral rewiring within the substrate in order to connect the two chip contact-connection regions to one another.

In accordance with one preferred development, the first chip contact-connection region is arranged in a manner lying opposite the first contact-connection area and/or the second chip contact-connection region being arranged in a manner lying opposite the second contact-connection area. This results in a purely vertical connection without lateral rewiring sections, and therefore enables a connection with a very short length between the semiconductor components.

In accordance with one preferred development, a contact-connection device is provided on the first and/or second chip contact-connection region in order to provide a conductive connection between the vertical through-plating device and the first and/or second chip contact-connection region.

In accordance with one preferred development, the contact-connection device has a small solder ball, a conductive adhesive and/or an elastic elevation, on which a conductor track is applied.

In accordance with one preferred development, the chip contact-connection region has a front chip contact-connection region on an active side and a rear chip contact-connection region on an inactive side of the semiconductor component opposite to the active side, an internal vertical through-plating device being provided within the semiconductor component which through-plating device conductively connects the front and the rear chip contact-connection region to one another.

In accordance with one preferred development, the first semiconductor component is arranged with the active side facing the substrate on the first contact-connection side and the second semiconductor component being arranged with the inactive side facing the substrate on the second contact-connection side.

In accordance with one preferred development, the semiconductor device has at least one third semiconductor component which is arranged on that surface of a semiconductor component which is remote from the substrate in such a way that a front chip contact-connection region of one of the two semiconductor components is connected to a rear chip contact-connection region of the second of the two semiconductor components.

In accordance with one preferred development, the semiconductor components have no housing.

Exemplary embodiments of the invention are illustrated in the drawings and are explained in detail in the description below.

BRIEF DESCRIPTION OF THE DRAWINGS

FIG. 7 shows a schematic illustration of a memory module arrangement according to the prior art.

DETAIL DESCRIPTION OF THE INVENTION

Identical reference symbols designate identical or functionally identical devices.

Figure 1:
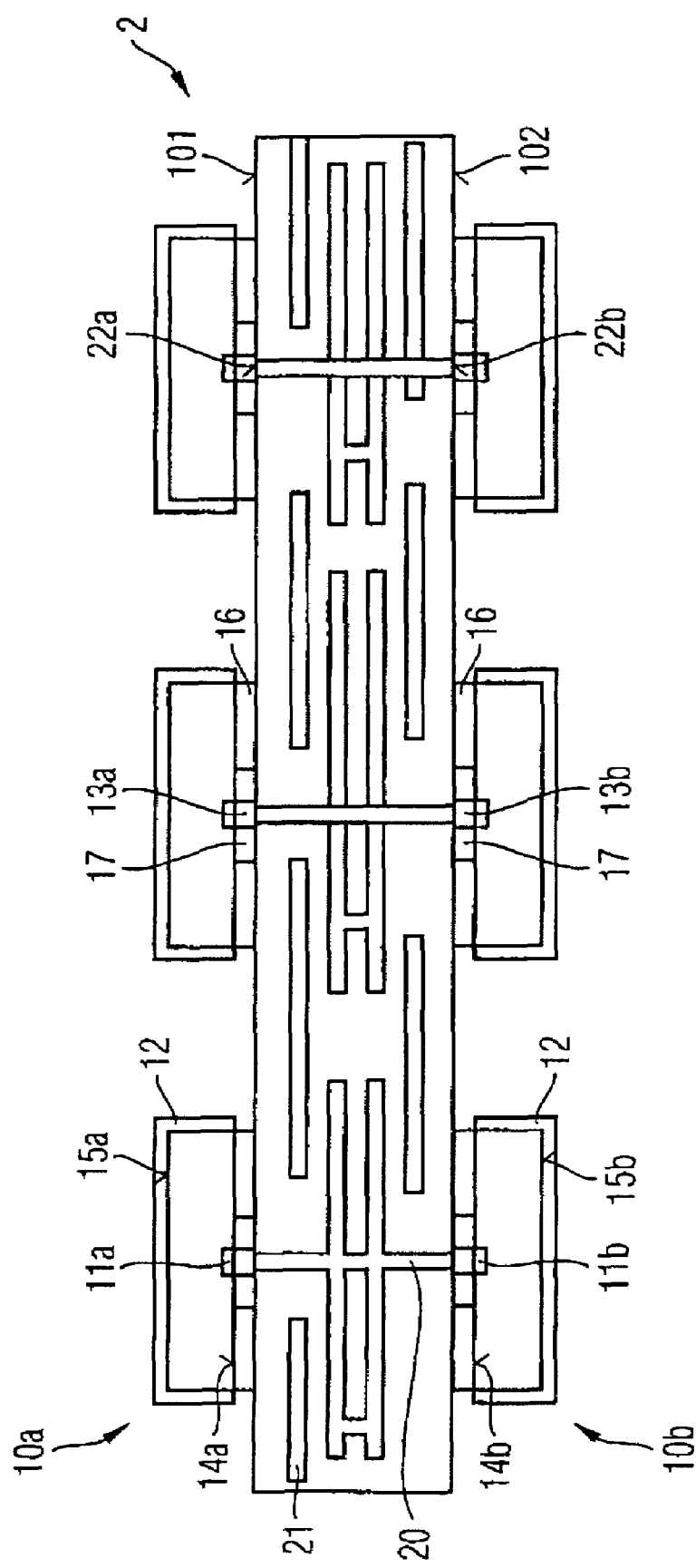
FIG. 1 shows a schematic illustration of one embodiment of the present invention.

FIG. 1 illustrates a schematic illustration of a first embodiment of the present invention. A substrate 2 is provided, which has an internal wiring device 21 within it and in part also on its first contact-connection side 101 and on its second contact-connection side 102 opposite to the first contact-connection side 101. The substrate 2 is advantageously a multilayer printed circuit board. However, the substrate 2 may also be formed from a semiconductor substrate with a corresponding wiring device.

The substrate 2 has one or more contact-connection areas 22a on the first contact-connection side 101, which are connected via a vertical through-plating device 20 to second contact-connection areas 22b on the second contact-connection side 102 of the substrate 2. The first 22a and second contact-connection areas 22b are arranged in a manner lying opposite one another.

One or more unhoused first semiconductor components 10a are arranged on the first contact-connection side. The semiconductor component 10a is e.g. a memory component. The first semiconductor components 10a are arranged in such a way that the first chip contact-connection region 11a of each first semiconductor component 10a faces the substrate 2. A first contact-connection device 13a connects the first chip contact-connection region 11a to the first contact-connection area 22a of the first contact-connection side 101 and thus produces a connection of the first semiconductor component 10a to the vertical through-plating device 22.

Unhoused second semiconductor components 10b are arranged on the second contact-connection side in a manner lying opposite the unhoused first semiconductor components 10a. Each second semiconductor component 10b is once again oriented in such a way that its second chip contact-connection region 11b faces the substrate 2. A second contact-connection device 13b provides a conductive connection between the chip contact-connection region 11b and the second contact area 22b and thus also the vertical through-plating device 22. This enables a conductive connection between the first 11a and the second chip contact-connection region 11b via the vertical through-plating device 20. This conductive connection has the advantage, inter alia, that its length is reduced to a minimum since no laterally running conductor track sections are necessary in order to provide the connection. On account of the resultant low inductance and capacitance of the connection, this device is suitable in particular for radiofrequency applications. Furthermore, the number of contact-connection transitions is small, whereby their contribution to the parasitic capacitances is advantageously kept small.

The semiconductor components 10a, 10b are coated with a covering layer 12. The latter may contain a polymer or polymide. The semiconductor components 10a and 10b are fixed by an adhesive layer 16 introduced between the semiconductor component 10a, 10b and the contact-connection side 101, 102. The adhesive layer 16 does not cover the chip contact-connection region 11a, 11b. In this case, if appropriate, the adhesive layer 16 may include cavities 17, in which the contact-connection device 13a, 13b is then situated.

Figure 2:
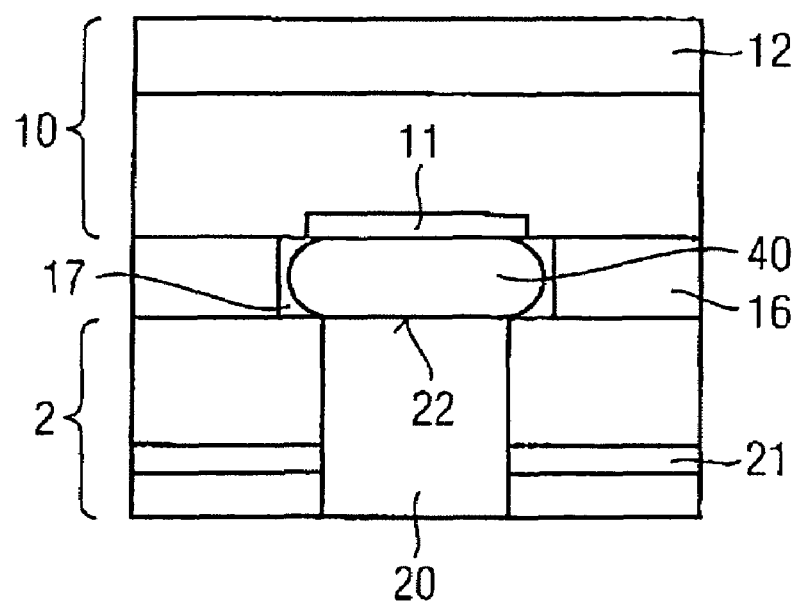
FIG. 2 shows a schematic enlargement of a chip contact-connection region of the embodiment.

A contact-connection device 13 of the first embodiment is illustrated in detail in FIG. 2. A semiconductor component 10 with a chip contact-connection region 11 is arranged on a substrate 2 with internal wiring devices 21 by means of an adhesive layer 16. The chip contact-connection region 11 is connected by a contact-connection device 13, which is formed by a conductive adhesive 40 in this embodiment, at the contact area 22 to a vertical through-plating device 20 introduced into the substrate 2. The conductive adhesive 40 has nickel and/or gold particles, which enable a good volume conduction, and therefore forms a good connection of the chip contact-connection region 11 to the vertical through-plating device 20. Moreover, this embodiment is insensitive to thermomechanical stress. A further embodiment provides for a small solder ball to be introduced instead of the conductive adhesive 40. After the small solder ball has been liquefied, a contact with very good conductivity is formed, but this contact-connection is sensitive to thermomechanical stress. An underfill e.g. within the cavity 17 leads to improved mechanical properties.

Figure 3:
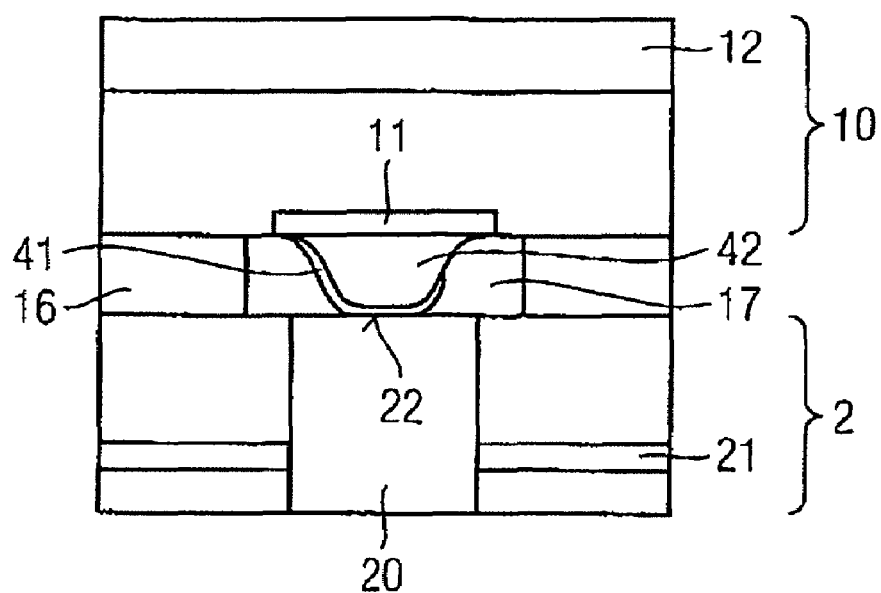
FIG. 3 shows a schematic illustration of an enlargement of a chip contact-connection region of a further embodiment of the present invention.

A second contact-connection device 13 of a further embodiment is illustrated in detail in FIG. 3. In this case, an elastic elevation 42 is applied on the chip contact-connection region 11. A conductor track 42 is led up onto the elastic elevation. The first end of the conductor track 42 is conductively connected to the chip contact-connection region 11, while the second end, by pressing onto the contact area 22 and onto the vertical through-plating device 20, forms a contact with these. The adhesive layers 16 then fix the semiconductor component 11 and a permanent connection thus forms in this way. The advantage of this embodiment of the contact-connection device 13 is that it is insensitive to thermomechanical stress and at the same time has a very high conductivity.

In an advantageous manner, the contact-connection device 13 can be applied to the semiconductor components 10a, 10b before the latter are separated out from a wafer assemblage. This enables cost-effective production.

The previous embodiments of the contact-connection device are provided for both the semiconductor components 10a and 10b. Therefore, in FIGS. 2 and 3 the reference symbols are specified as numerals without indexing letters.

Figure 4:
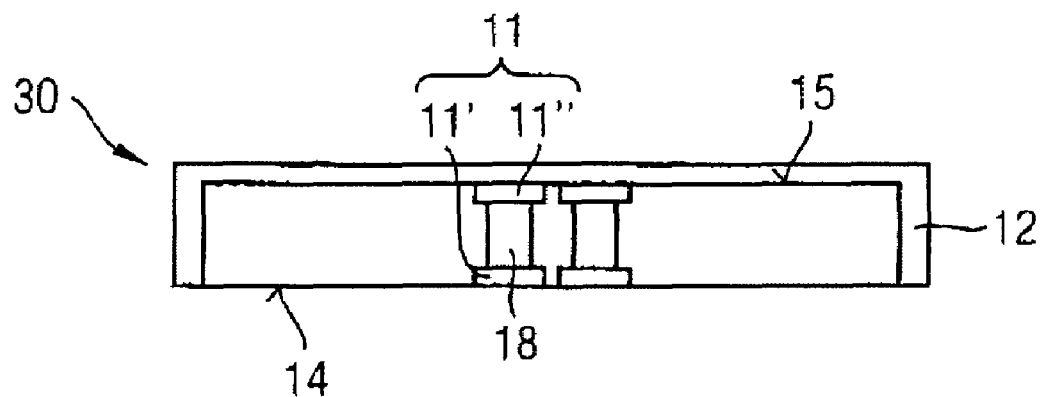
FIG. 4 shows a schematic illustration of a semiconductor component according to a further embodiment of the present invention.
Figure 5:
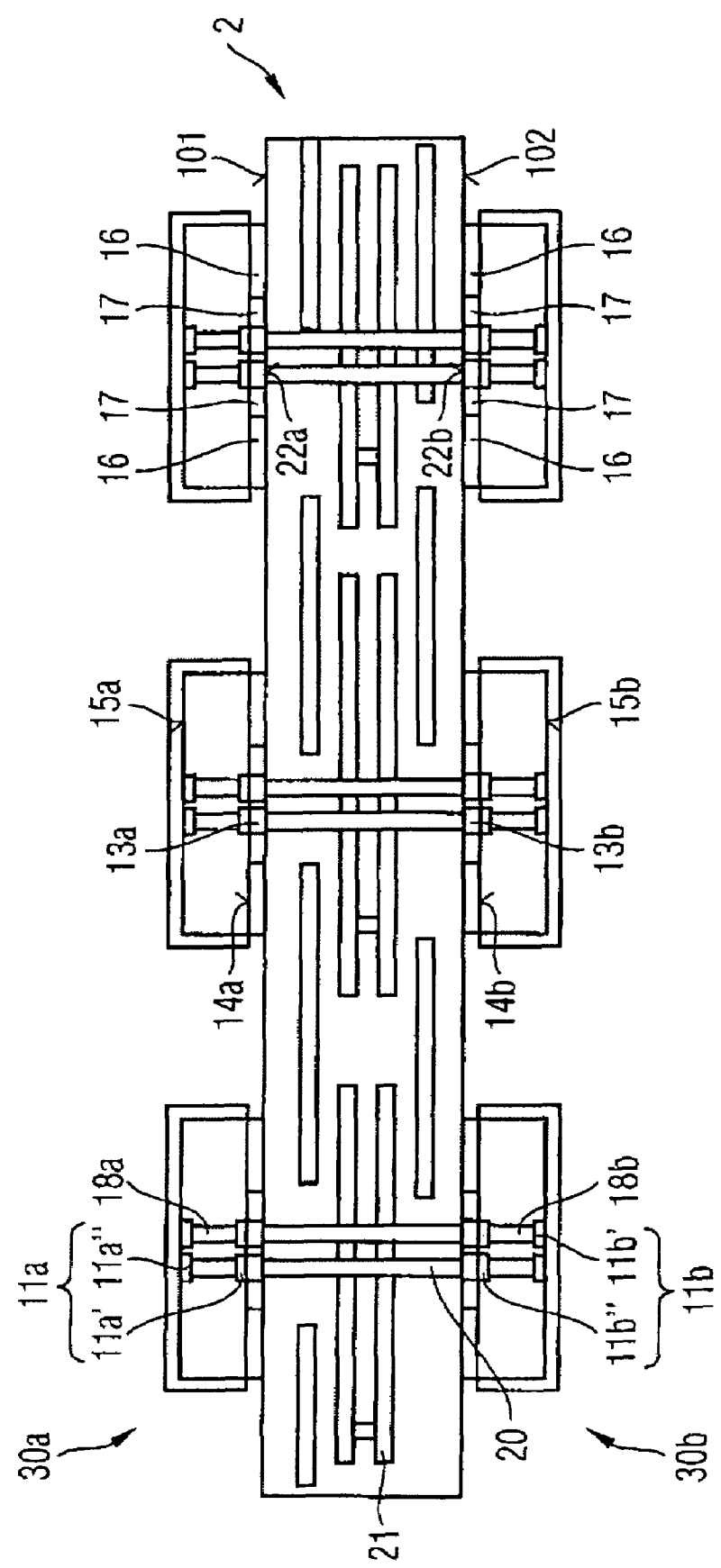
FIG. 5 shows a schematic illustration of a further embodiment of the present invention, which uses the semiconductor component from FIG. 4.

FIGS. 4 and 5 illustrate a further embodiment of the present invention. FIG. 4 shows a semiconductor component 30. The latter has a chip contact-connection region 11 composed of a front chip contact-connection region 11' and a rear chip contact-connection region 11". The front chip contact-connection region 11' is arranged on the active side 14 of the semiconductor component 30. The rear chip contact-connection region 11" is arranged on an inactive side 15 opposite to the active side 14. The front 11' and the rear chip contact-connection region 11" are connected to one another by an internal vertical through-plating device 18 within the semiconductor component 30.

FIG. 5 illustrates a substrate 2 with a vertical through-plating device 21. First contact-connection areas 22a are arranged on a first contact-connection side 101 and second contact-connection areas 22b are arranged on a second contact-connection side 102 opposite to the first contact-connection side, which are connected by a vertical through-plating device 20.

First semiconductor components 30a corresponding to the semiconductor component 30 discussed with respect to FIG. 4 are arranged on the first contact-connection side 101. The first semiconductor components 30a are in each case oriented with the front first chip contact-connection region 11a' facing the substrate 2. A first contact-connection device 13a connects the front first chip contact-connection region 11a' to the first contact-connection area 22a.

Second semiconductor components 30b likewise corresponding to the semiconductor component 30 described with respect to FIG. 4 are arranged on the second contact-connection side 102. In contrast to the first semiconductor components 30a, the second semiconductor components 30b are oriented with the rear second chip contact-connection region 11b" facing the substrate 2. A second contact-connection device 13b connects the rear second chip contact-connection region 11b" to the second contact-connection area 22b. This results in a conductive connection between the front chip contact-connection region 11a' of one semiconductor component and the rear chip contact-connection region 11b" of the other semiconductor component via the vertical through-plating device 20. This is advantageous particularly when the semiconductor components 30a and 30b that are to be connected to one another have two or more rows of contacts in the respective chip contact-connection regions 11a, 11b since the vertical through-plating device 20 requires only vertically running vias in that case as well. However, if the two semiconductor components 30a and 30b were arranged in each case with their active sides 14 facing the substrate 2, it is necessary to guide the vias in the vertical through-plating device 20 crosswise in order to connect the mutually corresponding contacts to one another.

It is evident that a further embodiment may have as many internal through-plating devices 18 as desired. The internal through-plating devices 18 and also the rear chip contact-connection regions 11" on the inactive side 15 of the semiconductor component 30 can be integrated in the semiconductor component 30 by means of conventional semiconductor fabrication methods during or after the fabrication of the semiconductor component 30. This ensures that a cost-effective fabrication in large numbers is possible.

Figure 6:
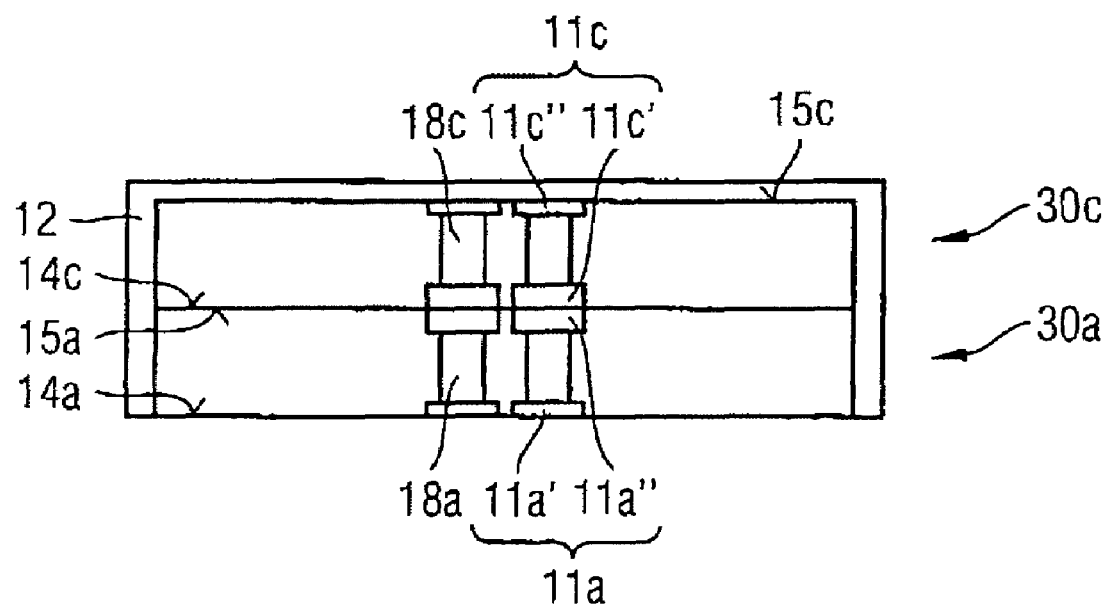
FIG. 6 shows a schematic illustration for stacking the semiconductor components from FIG. 4.

FIG. 6 shows how a plurality of semiconductor components 30 from FIG. 4 can be stacked. This gives rise to the possibility of a direct wiring between two semiconductor components 30. A third semiconductor component 30c is arranged on an inactive side 15 of a first semiconductor component 30a. In this case, the rear chip contact-connection regions 11a" of the third semiconductor component 30c are connected to the front chip contact-connection regions 11c' of the first semiconductor component 30a. Such a stack of two or else more semiconductor components 30 can be applied on the substrate 2 in the same way as an individual semiconductor component 30.

Although the present invention has been described on the basis of the above exemplary embodiments, it is not restricted thereto.

In particular, all of the semiconductor components are not necessarily identical. In this case, it is conceivable for different types of semiconductor components to be combined to form a module and likewise to benefit from the shortest connections to an opposite semiconductor component.

LIST OF REFERENCE SYMBOLS 1a, 1b Housed semiconductor component
2 Substrate
3 Semiconductor component
5 Bonding wiring device
6 Rewiring device
4 Chip contact-connection region of 3
7 Interposer substrate
8 Contact-connection area of 2
10 Semiconductor component
10a, 30a First semiconductor component
10b, 30b Second semiconductor component
30c Third semiconductor component
11a First chip contact-connection region
11b Second chip contact-connection region
11c Third chip contact-connection region
11', 11a', 11b', 11c' Front chip contact-connection region
11", 11a", 11b", 11c" Rear chip contact-connection region
12 Covering layer
13a, 13b Contact-connection device
14, 14a, 14b, 14c Active side
15, 15a, 15b, 15c Inactive side
16 Adhesive layer
17 Cavity
18 Internal vertical through-plating device
20 Vertical through-plating device
21 Conductor track
22a First contact-connection area
22b Second contact-connection area
30 Semiconductor component
30c Third semiconductor component
40 Conductive adhesive layer
41 Conductor track
42 Elastic elevation
100 Connecting path
101 First contact-connection side
102 Second contact-connection side

What is claimed is:
1. Semiconductor device having:
(a) a substrate having a first and a second contact-connection side, provision being made of at least one vertical through-plating device for the connection of a first contact area on the first contact-connection side and a second contact area on the second contact-connection side;

(b) a first semiconductor component, which is arranged with a first chip contact-connection region facing the substrate on the first contact-connection side;

(c) a second semiconductor component, which is arranged with a second chip contact-connection region facing the substrate on the second contact-connection side; the first chip contact-connection region being conductively connected to the second chip contact-connection region via the vertical through-plating device; the first chip contact-connection region having a front chip contact-connection region on an active side of the first semiconductor component and a rear chip contact-connection region on an inactive side of the first semiconductor component opposite to the active side, an internal vertical through-plating device being provided within the semiconductor component which internal through-plating device conductively connects the front and the rear chip contact-connection regions of the first semiconductor component to one another, and (d) a third semiconductor component being arranged on that surface of a semiconductor component which is remote from the substrate in such a way that a front chip contact-connection region of one of the two semiconductor components is connected to a rear chip contact-connection region of the second of the two semiconductor components.

2. Semiconductor device according to claim 1, the first chip contact-connection region being arranged in a manner lying opposite the first contact-connection area and/or the second chip contact-connection region being arranged in a manner lying opposite the second contact-connection area.

3. Semiconductor device according to claim 1, a contact-connection device being provided on the first and/or second chip contact-connection region in order to provide a conductive connection between the vertical through-plating device and the first and/or second chip contact-connection region.

4. Semiconductor device according to claim 3, the contact-connection device having a small solder ball, a conductive adhesive and/or an elastic elevation, on which a conductor track is applied.

5. Semiconductor device according to claim 1, the first semiconductor component being arranged with the active side facing the substrate on the first contact-connection side and the second semiconductor component being arranged with the inactive side facing the substrate on the second contact-connection side.

6. Semiconductor device according to claim 1, the semiconductor components being unhoused.

7. Semiconductor device according to claim 1 two or more semiconductor components are arranged one on top of the other.

8. Semiconductor device having:

(a) a substrate having a first contact-connection side, a second contact-connection side, and at least one vertical through-plating device for connecting a first contact area on the first contact-connection side and a second contact area on the second contact-connection side;

(b) semiconductor components each comprising a front chip contact-connection region on an active side of the semiconductor component, a rear chip contact-connection region on an inactive side of the semiconductor component, the inactive side of one semiconductor component being opposite to the active side of the same semiconductor component, and an internal vertical through-plating device within each semiconductor component which internal through-plating device conductively connects the front chip contact-connection region and the rear chip contact-connection region;

(c) a first semiconductor component of the semiconductor components is arranged on the first contact-connection side of the substrate, the front chip contact-connection region of the first semiconductor component facing the first contact area;

(d) a second semiconductor component of the semiconductor components is arranged on the second contact-connection side of the substrate, the rear chip contact-connection region of the second semiconductor component facing the second contact area;

(e) the front chip contact-connection region of the first semiconductor component is electrically connected to the front chip contact-connection region of the second semiconductor component via the internal through-plating device of the second semiconductor component and the through-plating device of the substrate, and (f) a third semiconductor component being arranged on that surface of a semiconductor component which is remote from the substrate in such a way that a front chip contact-connection region of one of the two semiconductor components is connected to a rear chip contact-connection region of the second of the two semiconductor components.

9. The semiconductor device according to claim 8, wherein the first semiconductor component and the second semiconductor component are identically formed.

10. The semiconductor device according to claim 9, wherein the first semiconductor component and the second semiconductor component are memory devices.

* * * * *